United States Patent [19]
Kurtz et al.

[11] Patent Number: 5,789,793
[45] Date of Patent: Aug. 4, 1998

[54] DIELECTRICALLY ISOLATED WELL STRUCTURES

[76] Inventors: Anthony D. Kurtz, 483 Winthrop Rd., Teaneck, N.J. 07666; Andrew V. Bemis, 21 Eldorado Dr., Chestnut Ridge, N.Y. 10977

[21] Appl. No.: 822,077

[22] Filed: Mar. 20, 1997

Related U.S. Application Data

[63] Continuation of Ser. No. 688,523, Jul. 30, 1996, abandoned, which is a continuation of Ser. No. 507,036, Jul. 31, 1995, abandoned.

[51] Int. Cl.$^6$ ............................................... H07L 21/76
[52] U.S. Cl. ........................ 257/508; 257/506; 257/499; 257/640; 257/649
[58] Field of Search ............................. 257/506, 507, 257/508, 640, 649, 525, 635, 499, 750, 754

[56] References Cited

U.S. PATENT DOCUMENTS

| | | | |
|---|---|---|---|
| 3,954,522 | 5/1976 | Roberson | 257/525 |
| 5,362,667 | 11/1994 | Linn et al. | 257/524 |
| 5,442,223 | 8/1995 | Fujii | 257/508 |

FOREIGN PATENT DOCUMENTS

| | | | |
|---|---|---|---|
| 63-065641 | 3/1988 | Japan | 257/508 |
| 0271567 | 11/1990 | Japan | 257/506 |

OTHER PUBLICATIONS

Translation of JP 2-271567 to Shirato.
Drum, C.M. et al., "A Lav-Stress Insulating Film on Silicon By Chemical Vapor Deposition", Journal of Applied Physics, vol. 39, No. 9, Aug. 1968, pp. 4458-4459.

*Primary Examiner*—Wael Fahmy
*Assistant Examiner*—David B. Hardy
*Attorney, Agent, or Firm*—Plevy & Associates

[57] ABSTRACT

A method for fabricating a semiconductor device comprising fabricating a sacrificial wafer having a substrate wafer which includes a diffused layer and one or two epi layers. The sacrificial wafer is fusion bonded to a separately fabricated carrier/handle wafer having a layer of oxide on its surface, to form a composite wafer. Selective regions of the composite wafer are anodized and oxidized to form a plurality of wells separated from each other by a dielectric insulating layer. Next, N– epi regions above P+ epi regions are removed or alternatively, P+ diffused layers are removed from above an N– epi layer in selected regions. Finally, P– or N– single crystal silicon is grown back to the removed regions, depending on how the regions were removed. If N– single crystal is grown back to the removed regions, a high temperature drive-in is employed to finish the processing. The final structure contains N and P regions which are dielectrically isolated from each other and from the substrate. The isolated well structure can now be used to house circuit elements such as resistors, diodes, transistors, scrs, etc., individually or multiply as desired.

10 Claims, 13 Drawing Sheets

5,789,793

1

DIELECTRICALLY ISOLATED WELL STRUCTURES

This is a continuation of application Ser. No. 08/688,523, filed on Jul. 30, 1996, now abandoned entitled DIELECTRICALLY ISOLATED WELL STRUCTURES, which is a Continuation of prior application Ser. No. 08/507,036, filed on Jul. 31, 1995, now abandoned.

FIELD OF THE INVENTION

This invention relates generally to semiconductor devices and more particularly, to semiconductor devices having dielectrically isolated circuit elements deposited thereon.

BACKGROUND OF THE INVENTION

Semiconductors can be provided with isolated circuit elements using many different techniques presently existing in the prior art. Of these techniques, the primary isolation technique that has been employed over the years in silicon semiconductors is a technique known in the art as junction isolation. This technique relies on the rectifying nature of a PN junction for circuit element isolation. The popularity of this technique is due primarily to its easy incorporation into standard semiconductor manufacturing processes. However, in recent years, junction isolation has been found to have many drawbacks for high density and high frequency semiconductor designs and in semiconductor designs which must operate in extreme environmental ranges, such as in high temperature and high radiation environments.

Substantially all of these problems have been solved by the development of silicon on insulator (SOI) structures which incorporate a type of oxide trench technique to isolate from device to device on the substrate. This combined approach referred to hereafter as dielectric isolation, provides superior isolating characteristics when compared to junction isolation. One advantage of dielectric isolation is the removal of any parasitic substrate devices, such as the "latch-up" scr, that plagues CMOS designs. A second advantage is in the reduction of substrate junction capacitance or device well capacitance, which degrades the circuit's performance. A third advantage is in the higher operating temperature of semiconductor devices having dielectrically isolated circuit elements when compared to semiconductors having junction isolated circuit elements. This is because at high operating temperatures, the large substrate junction of a junction isolated circuit element is prone to current leakage while the oxide layer of a dielectrically isolated circuit element does not. A fourth advantage involves the substantial elimination of leakage current in high radiation semiconductor operating environments. More specifically, junction isolated circuit elements leak current in high radiation semiconductor operating environments due to electron hole pair generation in the large substrate junction by cosmic rays. No such leakage mechanism occurs in dielectrically isolated circuit elements.

Currently there are two main SOI fabrication techniques, wafer bonding and separation by implanted oxygen (SIMOX). Neither one of these two techniques is easy to implement in production. In particular, the wafer bonding technique involves an oxide layer bonded between two single crystal layers. However, extensive machining is required to form the single crystal layers. SIMOX, while more easily integrated into a standard IC process than wafer bonding, undesirably creates very thin layers of oxide isolation and single crystal silicon, each typically less than 5000 angstroms. The thin oxide layer does not reduce the substrate capacitance to the degree that a thicker oxide layer would, and the thin single crystal layer lacks the high quality crystallographic characteristic of a typical single crystal silicon layer. Moreover, additional epi layers are needed to thicken the thin single crystal layer adding to the manufacturing cost of the semiconductor device.

Typical device to device isolation is presently achieved by using polysilicon filled, oxide wall trenches. The technique used in making this type of structure is complex and involves first removing the single crystal down to the oxide layer to form a trench. This is primarily achieved by using reactive ion etching (RIE) techniques. Next a thin oxide layer is grown along the walls of the trench to provide dielectric isolation. Finally, the oxide-lined trench is filled with polysilicon to complete the structure. The multiple steps involve in this technique add to the expense of the finished product.

It is, therefore, an object of the present invention to provide a method for fabricating a plural conductivity specific semiconductor device or multiple semiconductor device, having silicon on insulator wells with solid oxide well to well trench insulation.

It is a further object of the present invention to provide a method which offers no restriction on the conductivity type, location, size, or number of the wells provided. The method of the present invention enables this to be achieve without restriction on insulator thickness, trench width, and/or well depth, and provides wells of superior crystallographic quality silicon for device, or multiple device manufacture.

SUMMARY OF THE INVENTION

In the method of the present invention, a sacrificial wafer, made with a diffused layer and one to two epi layers, is fusion bonded to a carrier/handle wafer having a layer of oxide on its surface. This oxide layer will eventually comprise the substrate insulating layer. Next, selective regions of the bonded wafers are anodized and oxidized to form a plurality of wells separated from each other by a dielectric insulating layer. Next, an N– epi region above P+ epi regions is removed or alternatively, P+ diffused layers are removed from above an N– epi layer in selected regions. Finally, P– or N– single crystal silicon is grown back to the removed regions, depending on how the regions were removed. If N– single crystal is grown back to the removed regions, a high temperature drive-in is employed to finish the processing. The final structure contains N and P regions which are dielectrically isolated from each other and from the substrate. It should be understood, however, that the conductivity type of any given well is independent of the conductivity types of its neighboring wells. Accordingly, any well arrangement based on conductivity type is possible in the present invention. Thus, the isolated well structure can now be used to house circuit elements such as resistors, diodes, transistors, scrs, etc., individually or multiply as desired.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

In the description which follows, all references made to orientation in terms of upper, lower, top, bottom, etc., are made for illustrative purposes only and are not intended to be limiting. Moreover, for simplicity in the detailed description of the figures which follows, the wells have been shown in an alternating conductivity arrangement. One of ordinary skill in the art will recognize, however, that any conductivity sequence is possible in the present invention.

Figure 1A:
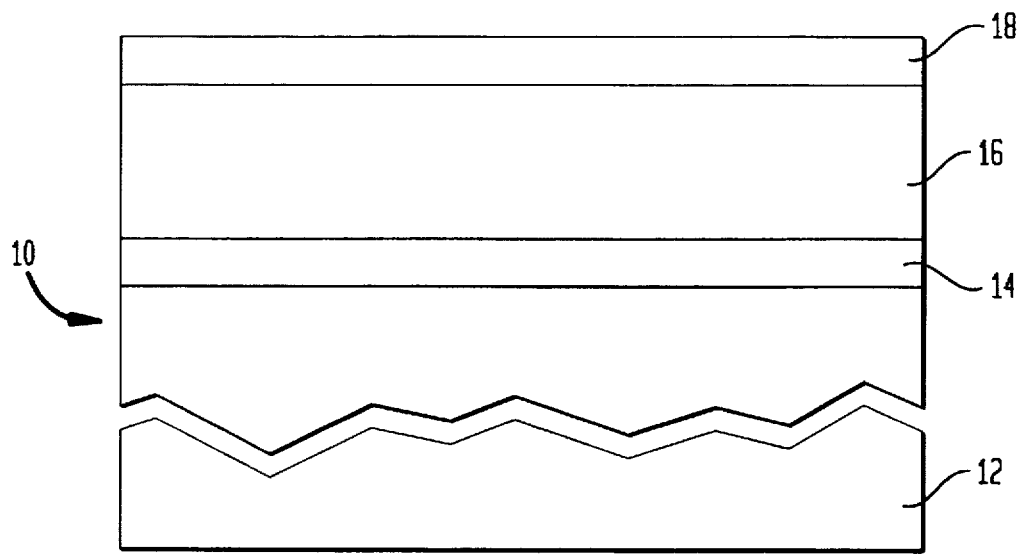
FIGS. 1A–1E are cross-sectional views which depict the fabrication of the sacrificial wafer.

A first exemplary embodiment of the method of the present invention will now be described starting with reference to FIG. 1A, which depicts a sacrificial wafer 10 fabricated using conventional techniques. The sacrificial wafer 10 will provide the single crystal silicon material that the semiconductor devices will be fabricated from. As shown in FIG. 1A, the sacrificial wafer 10 comprises an underlying monocrystalline N– silicon substrate 12 having a P+ layer 14 diffused into the upper surface thereof. An N– epi layer 16 is formed on the P+ layer 14 by epitaxially growing an N– single crystal silicon on top of the P+ diffused layer 16. A P+ epi layer 18 of P+ single crystal silicon is epitaxially grown on the N– epi layer 16. The P+ diffused layer 14 operates as an etch stop during later processing. The N– epi layer 16 will be used to fabricate N– wells and the P+ epi layer 18 will be used to fabricate P wells.

The P+ epi layer 18 is generally grown to a thickness of approximately 1 μm, while the N– epi layer 16 is grown to a thickness of approximately 4 μm. The P+ diffused layer 14 generally extends approximately 1 μm into the N– substrate. The N– substrate is substantially thicker than the other layers and is generally on the order of several hundred micrometers in thickness.

Figure 1B:
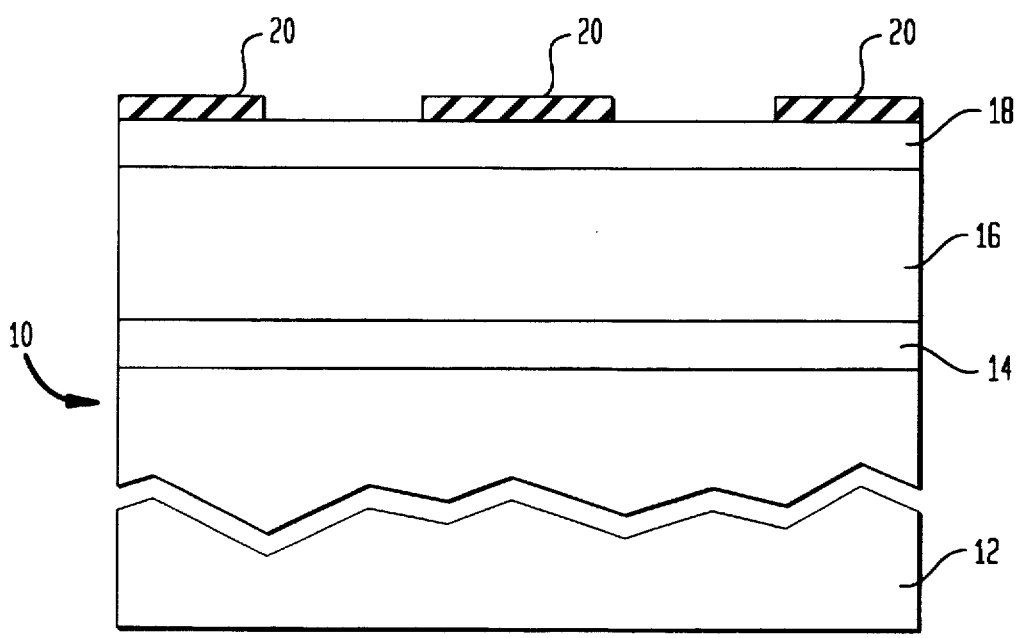

In FIG. 1B, a mask layer 20 consisting of a plurality of nitride islands have been fabricated across the P+ epi layer 18 of the sacrificial wafer 10 in a predetermined arrangement. The structure shown in FIG. 1B is fabricated by depositing a layer of nitride on the P+ epi layer 18 and then selectively etching this layer to form the nitride mask layer 20. The thickness of the nitride layer is generally on the order of approximately 1000 angstroms. Selective etching of the nitride layer is accomplished by first depositing a layer of quartz over the nitride layer. The quartz layer is then patterned using conventional photolithographic and etching techniques. The patterned quartz layer operates to mask off areas of the nitride layer which are to remain after the nitride layer is etched. More specifically, the etchant used to etch the nitride layer will etch away only the exposed areas of the nitride layer which are unprotected by the quartz layer. The patterned quartz layer is subsequently removed leaving the nitride mask layer 20 shown in FIG. 1B. The nitride mask layer 20 will ultimately determine the layout of the wells and their conductivity type as will become apparent immediately below.

Figure 1C:
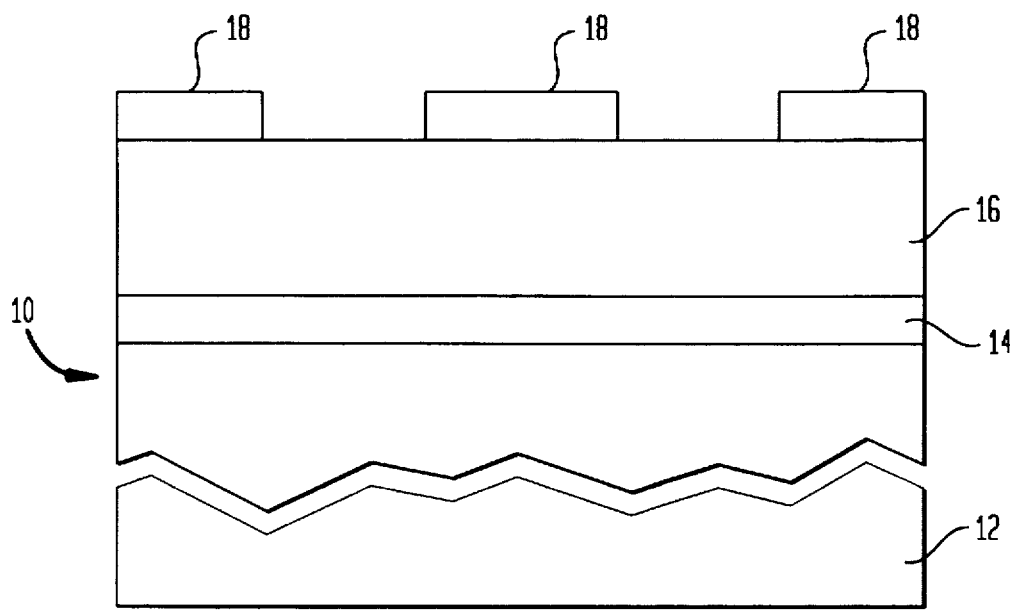

FIG. 1C, shows the P+ epi layer 18 after it has been selectively etched using the nitride mask layer 20 shown in FIG. 1B. The patterned P+ epi layer 18 structure shown in FIG. 1C illustrates the result of this process step after the nitride mask layer 20 has been removed. The remaining portions of the P+ epi layer 18 operate as "seed crystal" sites in later device processing as will be explained later.

Figure 1D:
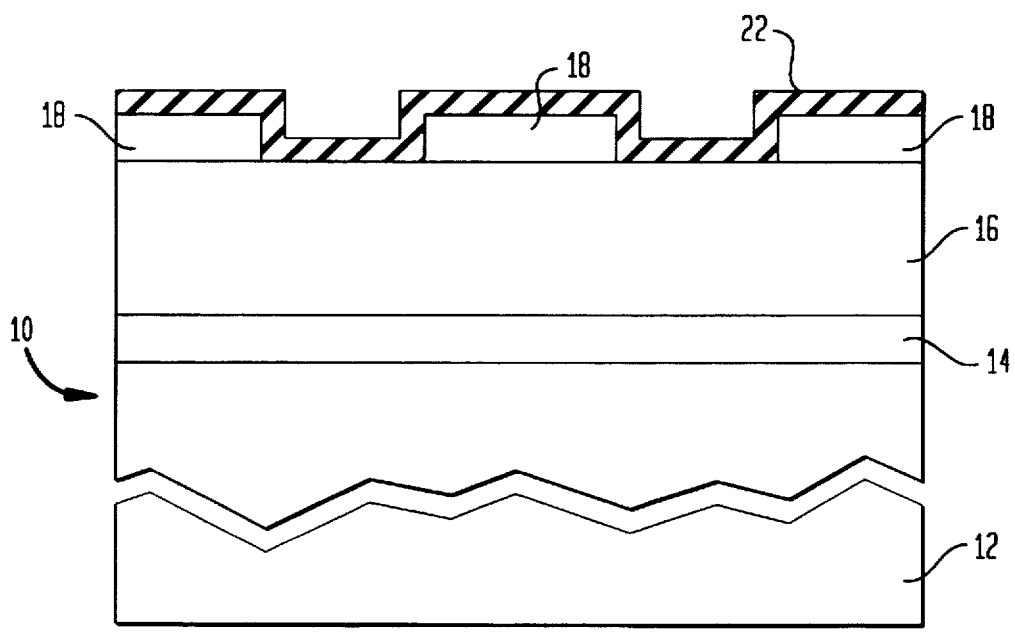

A second nitride layer 22, on the order of approximately 2000 angstroms thick, is deposited across the sacrificial wafer 10 so that it covers the patterned P+ epi layer 18 and the exposed areas of the N-epi layer 16 as shown in FIG. 1D. The second nitride layer 22 operates as an etch stop for an upcoming anodic etching processing step and will also provide additional dielectric isolation for the final structure.

Figure 1E:
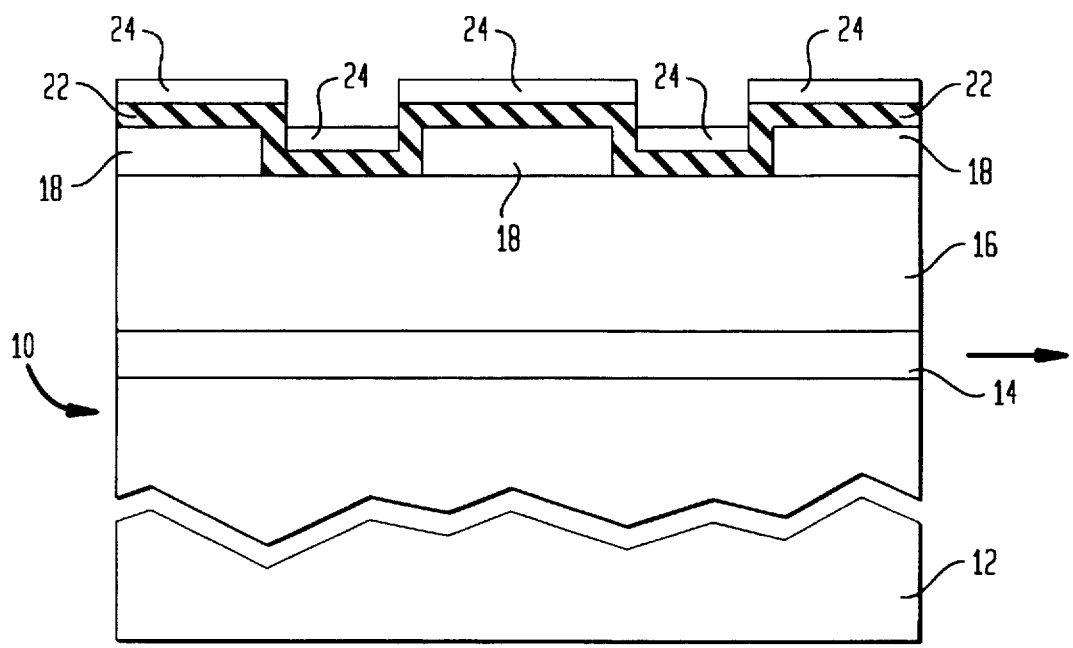

In FIG. 1E, a P+ doped polysilicon layer 24 is shown deposited on the surface of the nitride layer 22. The P+ doped polysilicon layer 24 operates as a preferred bonding layer as will be described later on in greater detail.

The P+ doped polysilicon layer 24 can be deposited by LPCVD, sputtering, or any other suitable technique known in the art. If LPCVD is used for depositing the P+ doped polysilicon layer 24, the P+ dopant can be incorporated during LPCVD or diffused or implemented in a later processing step. The P+ doped polysilicon layer 24 is deposited to a thickness of approximately 2000 angstroms.

Figure 2:
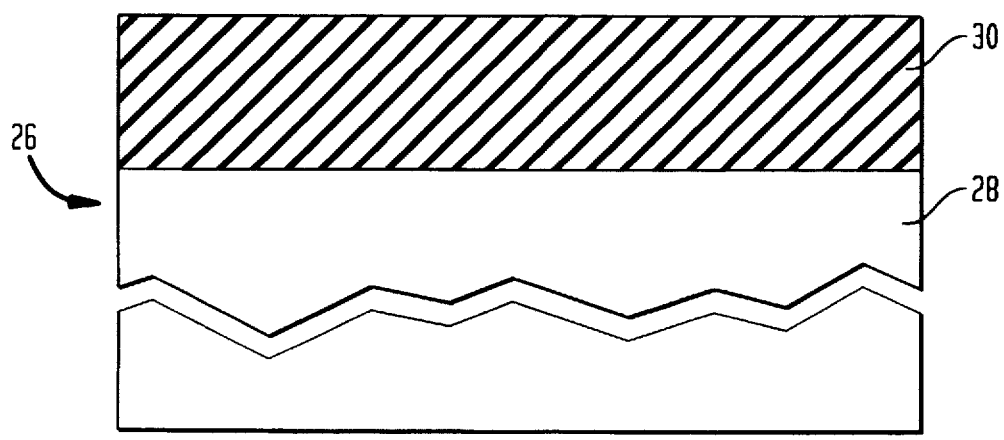
FIG. 2 is a cross-sectional view which depicts the carrier wafer.

FIG. 2 shows a handle/carrier wafer 26 to which the sacrificial wafer 10 will be later bonded to. The handle/carrier wafer 26 preferably comprises N– substrate 28 with an oxide layer 30 formed across the surface thereof using conventional oxidation techniques. The approximate thickness of the oxide layer 30 is generally 3 μm to provide a low capacitance dielectric insulating layer. Further, the oxide layer 30 also operates as a bonding layer as will be explained immediately below.

Figure 3:
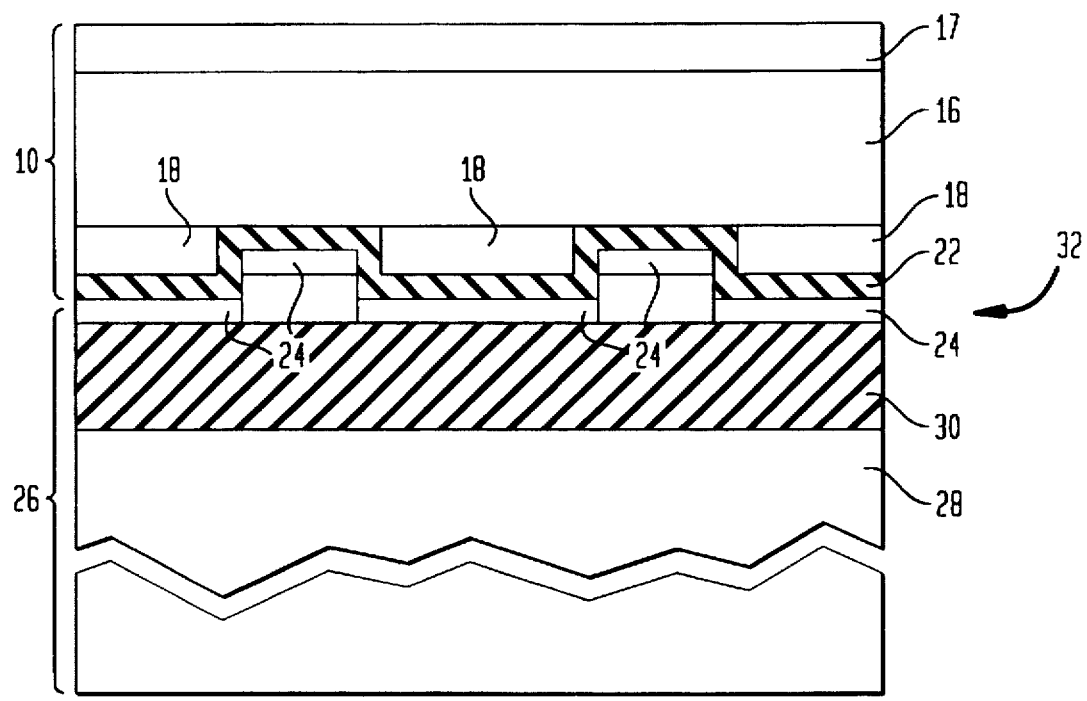
FIG. 3 is a cross-sectional view which depicts the bonding together of the sacrificial wafer of FIG. 1E to the carrier wafer of FIG. 2.

FIG. 3 depicts the result of several processing operations. As shown therein, the handle wafer 26 of FIG. 2 has been bonded to the sacrificial wafer 10 of FIG. 1E to form a composite wafer 32. The bonding process is performed in accordance with a preferred fusion bonding technique which utilizes the earlier described P+ doped polysilicon layer 24 of the sacrificial wafer 10 and the oxide layer 30 of the handle/carrier wafer 26 as bonding layers. The details of such a technique are described in U.S. Pat. No. 5,286,671 entitled FUSION BONDING TECHNIQUE FOR USE IN FABRICATING SEMICONDUCTOR DEVICES, to A. Kurtz et al., issued Feb. 1994, and assigned to Kulite Semiconductor Products, Inc., the assignee herein. The entire disclosure of U.S. Pat. No. 5,286,671 is incorporated herein by reference.

Although the preferred bonding layer used on the sacrificial wafer 10 is the earlier described P+ doped polysilicon layer 24, other bondable layers can be utilized on this wafer to fusion bond it to the handle carrier wafer 26. For example, an oxide layer (not shown) can be deposited in place of P+ doped polysilicon layer 24 on the sacrificial wafer 10. Accordingly, the bonding of the two wafers would take place between this oxide layer on sacrificial wafer 10 and the oxide layer 30 on the handle wafer 26. In another example, the deposition of the P+ doped polysilicon layer 24 and the nitride layer 22 would not be performed. Accordingly, bonding would then take place between the P+ epi silicon layer 18 on the sacrificial wafer 10 and the oxide layer 30 on the handle wafer 26. In a third example, the P+ doped polysilicon layer 24 would not be deposited so that bonding takes place between the nitride layer 22 on the sacrificial wafer 10 and the oxide layer 30 on the handle wafer 26.

Moreover, it should be understood, that the oxide layer 30 of the handle/carrier wafer 26 may be omitted if another type of bonding technique other than the preferred fusion bonding technique is implemented into the method of the present invention.

Referring again to FIG. 3, it can be seen that the N− substrate 12 of the sacrificial wafer 10 has been removed entirely down to the P+ diffusion layer 14 in a selective conductivity etching process which utilizes the P+ diffusion layer 14 as an etch stop.

Figure 4A:
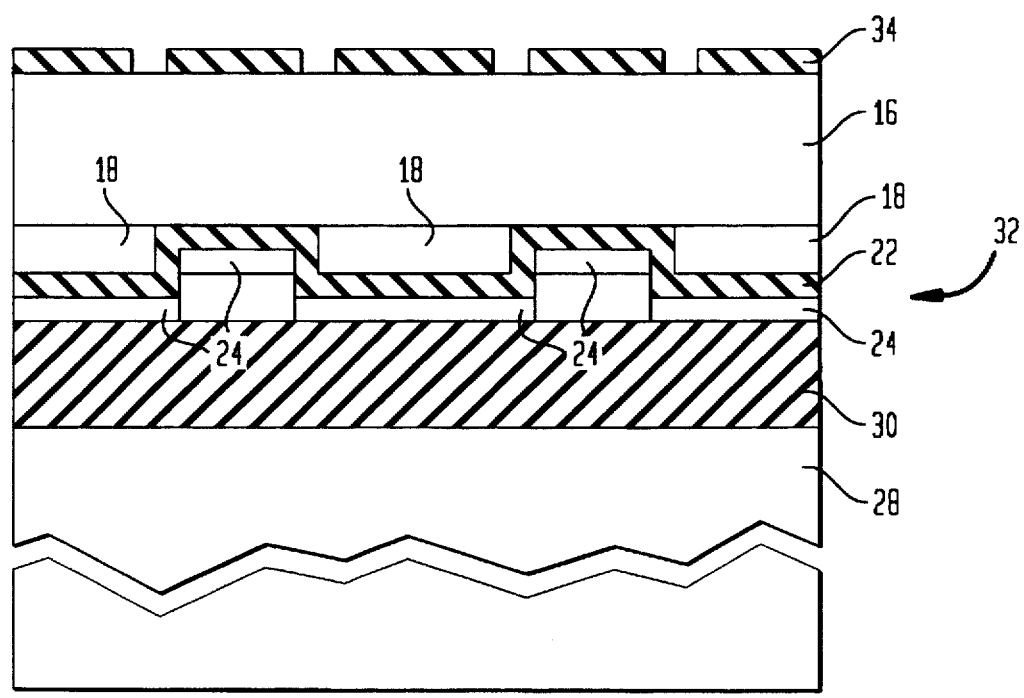
FIGS. 4A–4F are cross-sectional views which depict the fabrication of the N and P wells.

In FIG. 4A, a mask layer 34 consisting of a plurality of nitride islands has been fabricated across the N− epi layer 16 of the composite wafer 32 (after removing the P+ diffused layer 14) in a predetermined arrangement. The structure shown in FIG. 4 is fabricated by depositing a layer of nitride on the N− epi layer 16, the thickness of the nitride layer 34 being on the order of approximately 1000 angstroms. This layer is followed by a quartz layer which is patterned into a mask so that the nitride layer can be selectively etched to form the nitride mask layer 34 (after removal of the quartz mask). The arrangement of the nitride mask layer 34 will be used later on in processing to define the areas on the composite wafer 32 to be converted to solid oxide for well to well dielectric isolation.

Figure 4B:
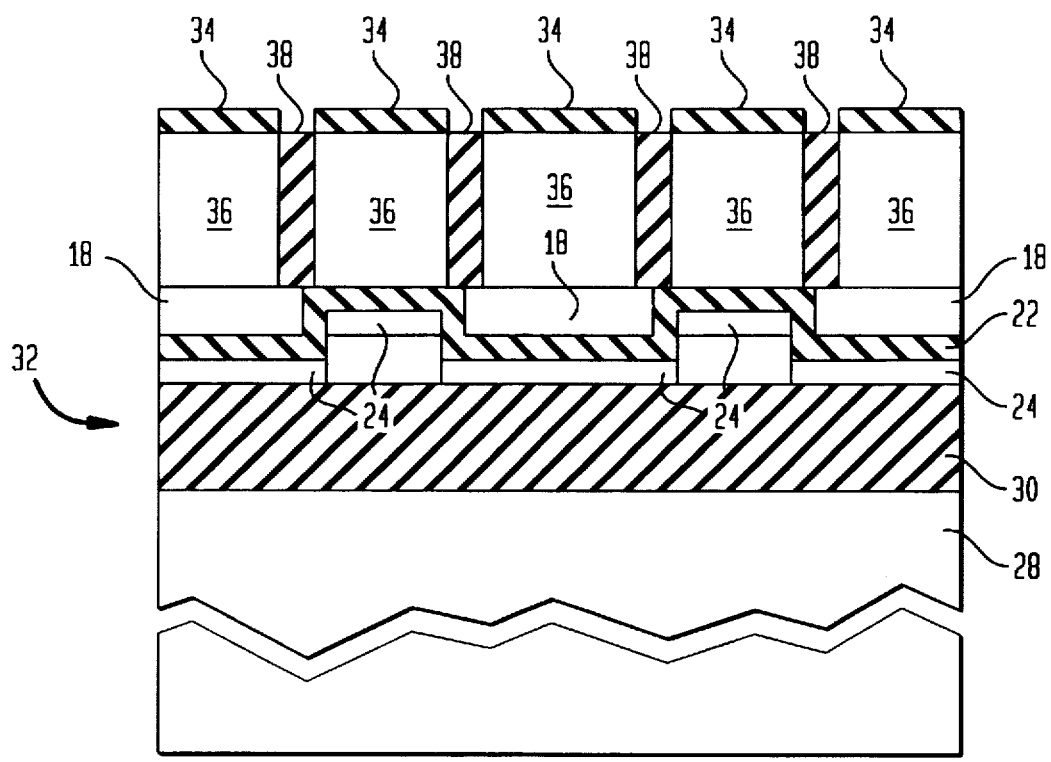

The composite wafer 32 of FIG. 4A is then anodized to convert the areas of the N− epi single crystal silicon layer 16 not covered by the nitride mask layer 34 into porous silicon. The composite wafer 32 is then oxidized to convert the porous silicon to silicon dioxide, thereby forming a plurality of N− wells 36 which are separated by solid silicon dioxide trenches 38 as depicted in FIG. 4B. As can be seen, the bottoms of the wells 36 must overlie the nitride layer 22 by at least half the width (or more) of a trench 38 to guarantee well to well isolation.

Figure 4C:
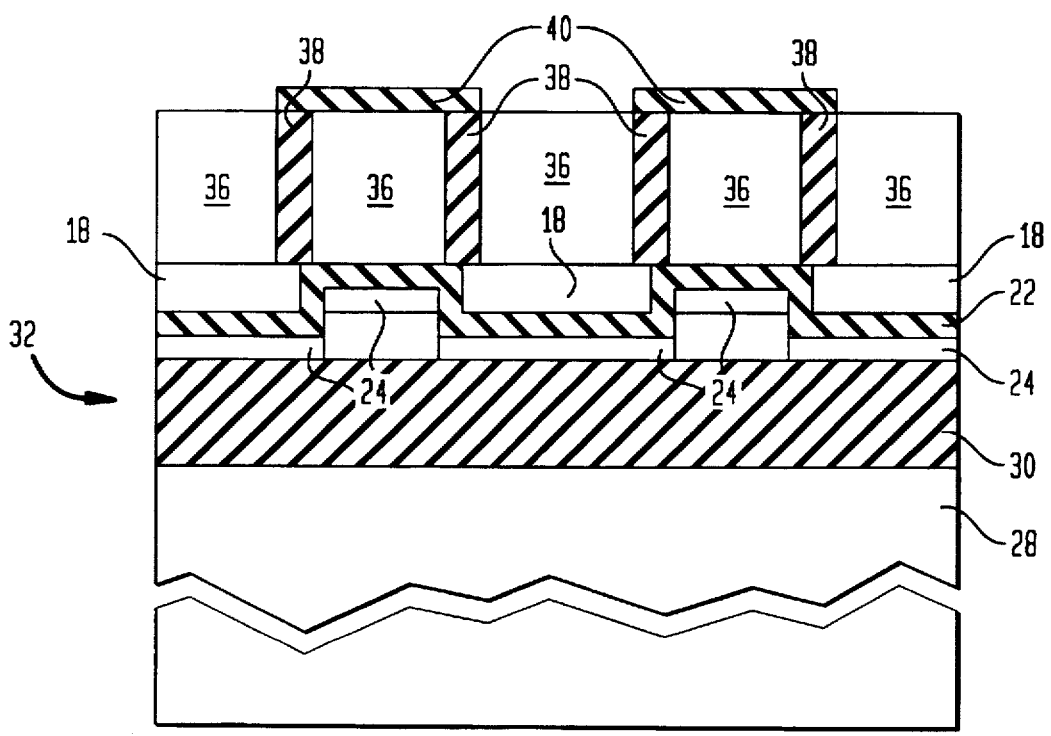

FIG. 4C depicts the composite wafer 32 after the nitride mask layer 34 has been removed and another nitride mask layer 40, of approximately 1000 angstroms, has been fabricated (as described with respect to the previous nitride mask layers) across the top surface thereof.

Figure 4D:
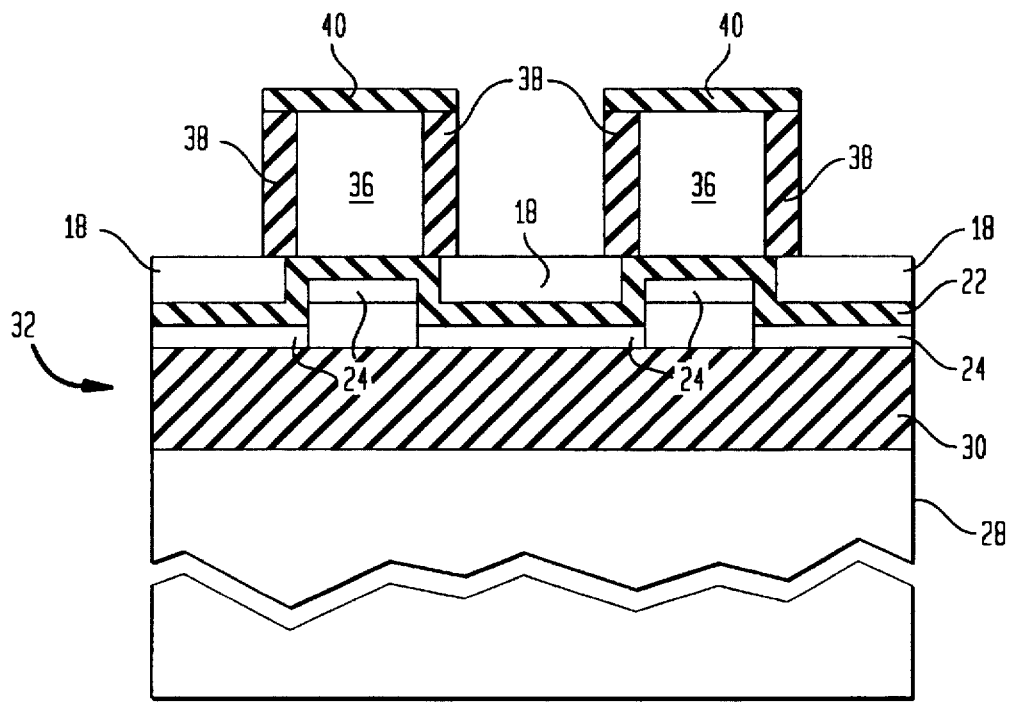

FIG. 4D depicts the structure of the composite wafer 32 after performing a selective conductivity etch to remove the N-single crystal silicon wells located directly above the p+ epi layer 18 "seed crystal" sites.

Figure 4E:
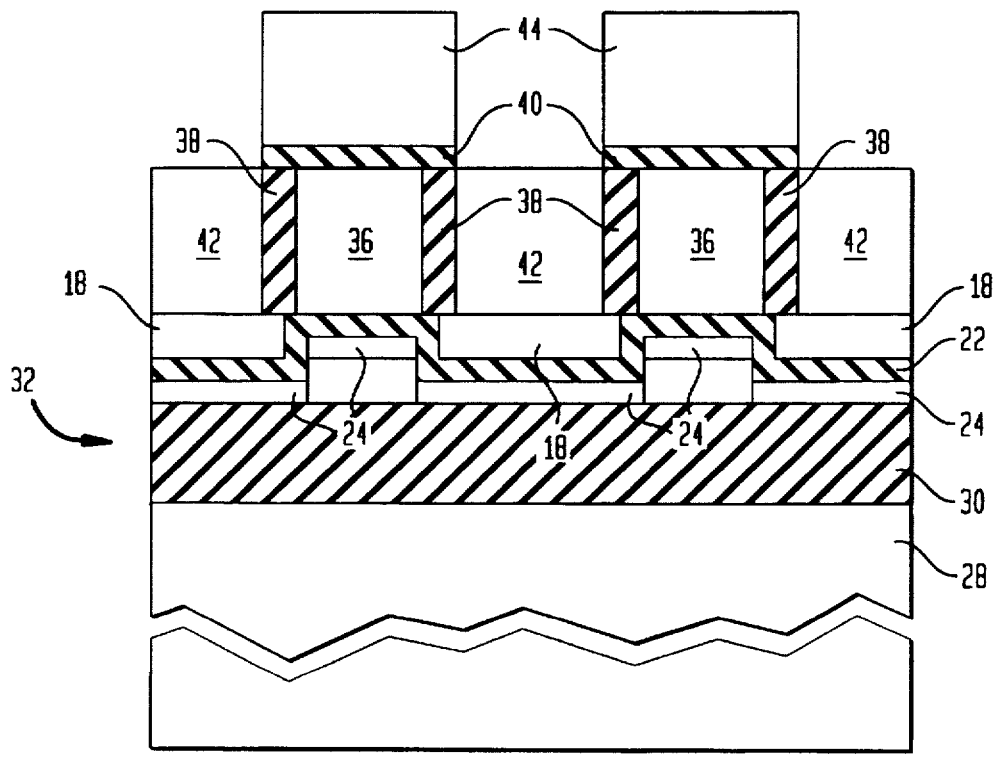

In FIG. 4E a P− layer has been epitaxially grown across the composite wafer 32. In the areas above the single crystal silicon P+ epi layer 18 "seed crystal" cites, the epilayer 42 grown thereat is P− single crystal silicon. In the areas above the nitride layer 40, the epilayer 44 grown thereat is P-polycrystalline silicon.

Figure 4F:
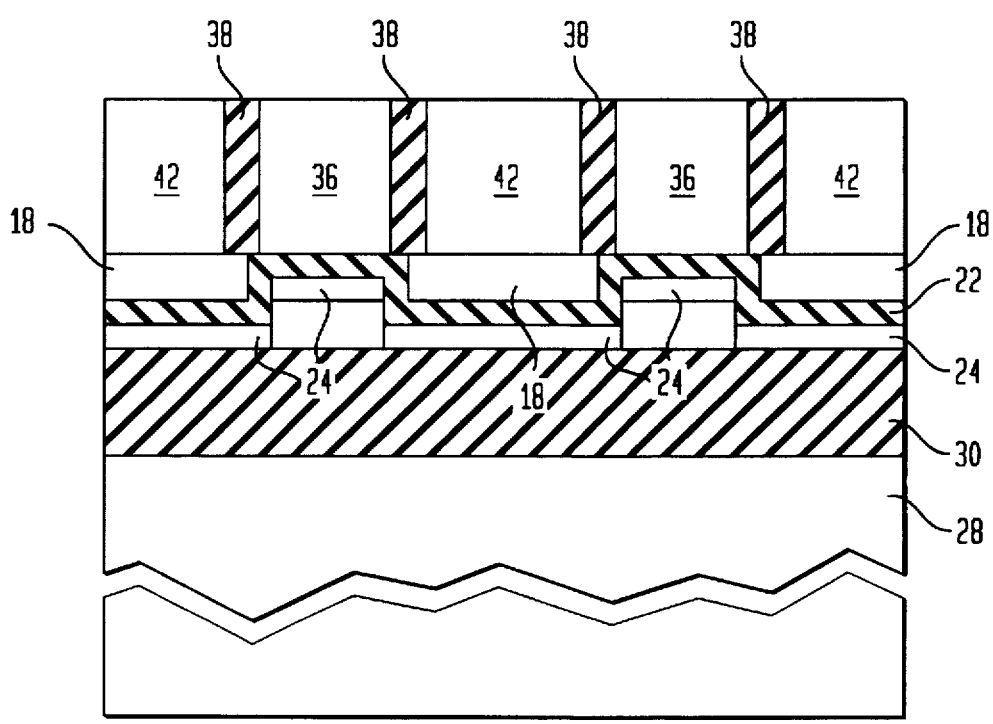

FIG. 4F depicts the final structure of the composite wafer 32 after the nitride layer 40 has been etched away thereby lifting off the P− polysilicon layer 44 which is disposed on top of. The structure shown therein comprises a first plurality of it dielectrically isolated P wells 42 of single crystal silicon and a second plurality of dielectrically isolated N− wells 36 of single crystal silicon. The P and N− wells are dielectrically isolated from the substrate 28 by the oxide layer 30. Moreover, the P and N− wells are dielectrically isolated from each other by the silicon dioxide trenches 38. This arrangement of dielectrically isolated wells of P or N− single crystal silicon can now be utilized to manufacture a plural conductivity specific semiconductor device or multiple semiconductor device.

In a second exemplary embodiment of the method of the present invention will now be described starting with FIG. 5A which depicts a sacrificial wafer 50 which has been fabricated using conventional techniques. The sacrificial wafer 50 comprises an underlying monocrystalline n-type silicon substrate 52 having a P+ layer 54 diffused into the upper surface thereof, followed by a N− single crystal silicon epi layer 56 grown on the P+ layer 54.

The N− epi layer 56 is generally grown to a thickness of approximately 4 μm, while the P+ diffused layer 54 generally extends approximately 0.5 μm into the N− substrate. The N-substrate 52 is substantially thicker than the other layers and is generally on the order of several hundred micrometers in thickness.

Figure 5A:
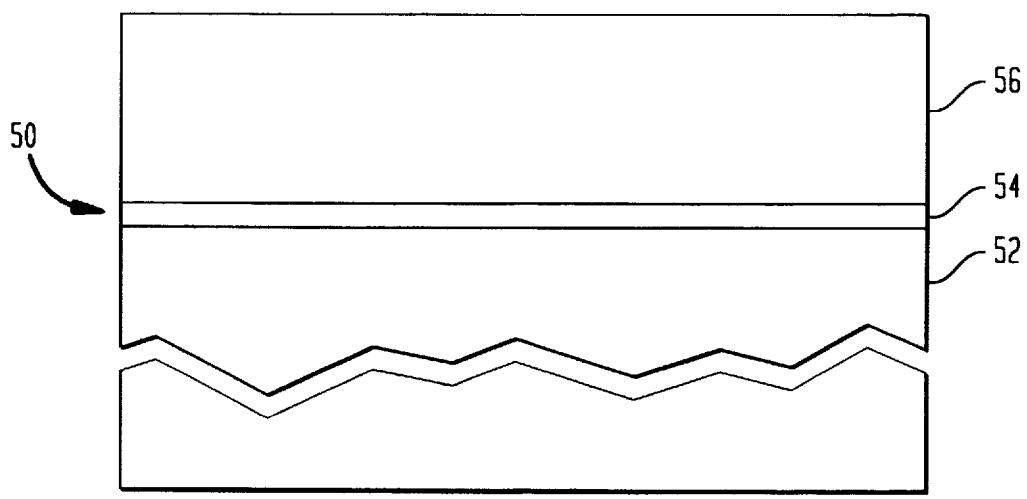
FIGS. 5A and 5B are cross-sectional views which depict the fabrication of the sacrificial wafer according to a second exemplary embodiment of the present invention.
Figure 5B:
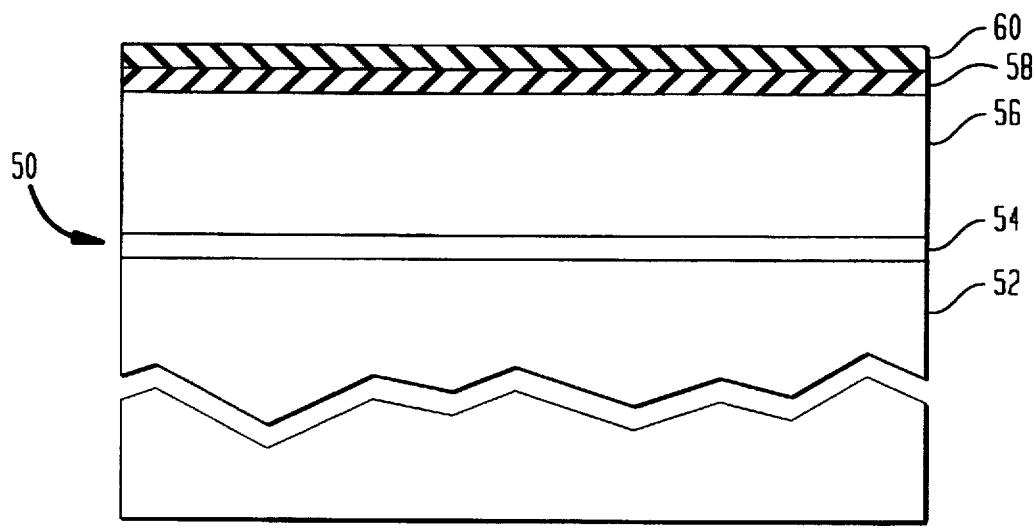

FIG. 5B depicts sacrificial wafer 50 of FIG. 5A with the addition of a nitride layer 58 deposited on the N− epilayer 56, followed by a layer 60 of oxide or quartz. The oxide can be deposited by CVD while quartz can be deposited by sputtering. In either case, the layer 60 is deposited to a thickness of approximately 1000 angstroms. The wafer structure shown in FIG. 5B is preferred in order that the oxide or quartz layer 60 can be used to fusion bond to the oxide layer of a handle/carrier wafer as will be described later. It should be understood, however, that other sacrificial wafer structures can be implemented in this embodiment of the present invention. For example, a P+ polysilicon layer (not shown) can be substituted for the oxide or quartz layer 60. Hence, a bond would be formed between this P+ polysilicon layer and the oxide layer 74 on the handle/carrier wafer 70. It is also possible to not deposit the oxide layer 60 so that bonding takes place between the nitride layer 58 and the oxide layer 74.

Figure 6:
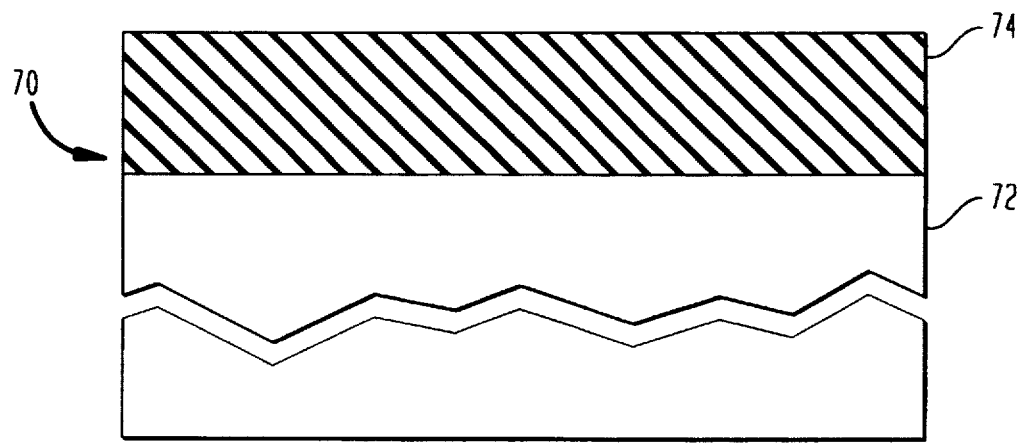
FIG. 6 is a cross-sectional view which depicts the carrier wafer used in the second exemplary embodiment of the present invention.

FIG. 6 shows a handle/carrier wafer 70 to which the sacrificial wafer 50 of FIG. 5B will be later bonded to. The handle/carrier wafer 70 is substantially identical to the one described in the first embodiment of the present method. Thus, the handle/carrier wafer 70 preferably comprises an N− substrate 72 with an oxide layer 74 formed across the surface thereof using conventional oxidation techniques. As in the handle wafer of first embodiment, the approximate thickness of the oxide layer 74 is generally 3 μm to provide a low capacitance dielectric insulating layer while also operating as a bonding layer as will be explained immediately below.

Figure 7:
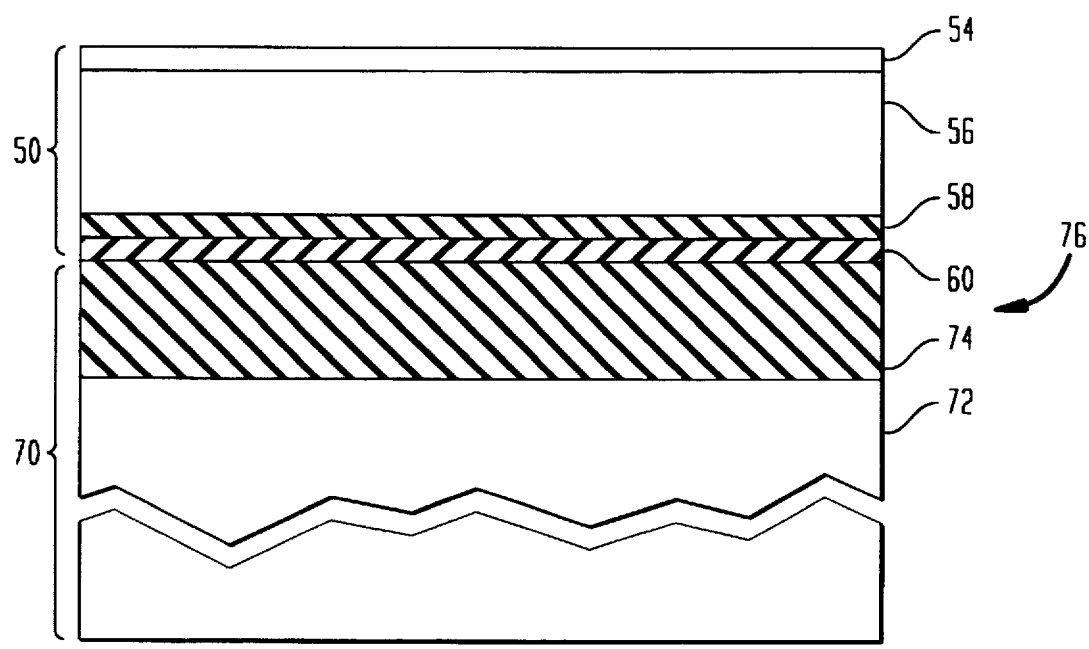
FIG. 7 is a cross-sectional view which depicts the bonding together of the sacrificial wafer of FIG. 5B to the carrier wafer of FIG. 6.

FIG. 7, depicts the results of several processing operations. The first processing operation involves fusion bonding the sacrificial wafer 50 to the handle/carrier wafer 70 whereby the oxide layer 60 of the sacrificial wafer 50 bonds to the oxide layer 74 of the handle/carrier wafer 70.

Next the sacrificial wafer's N− substrate is conductivity selectively etched away to the P+ diffusion which acts as the etch stopping layer as shown in FIG. 7.

Figure 8A:
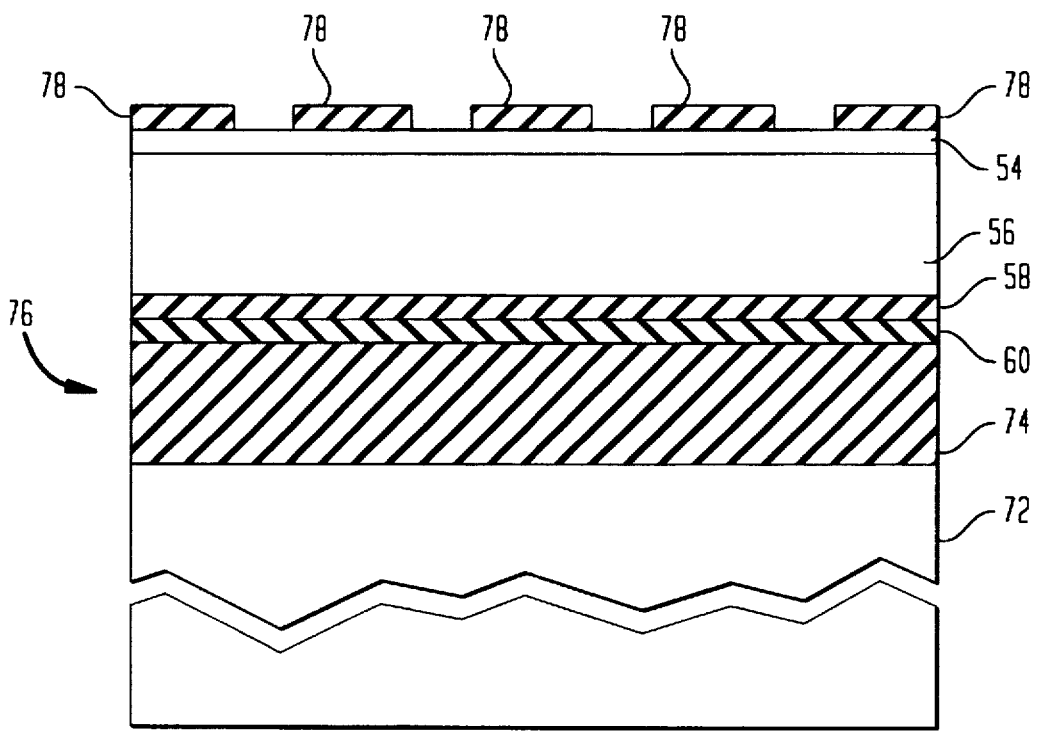
FIGS. 8A–8G are cross-sectional views which depict the fabrication of the N and P wells according to the second exemplary embodiment of the present invention.

In FIG. 8A, the composite wafer 76 is shown after a processing sequence where a nitride mask layer 78 has been deposited across the P+ diffused layer 54. The nitride mask layer 54 is fabricated using the same techniques described earlier above in regard to the nitride mask layers of the previous embodiment. The thickness of the nitride layer 54 is approximately 1000 angstroms. The nitride mask layer 54 is used define the areas that will be eventually converted to form solid oxide trenches.

Figure 8B:
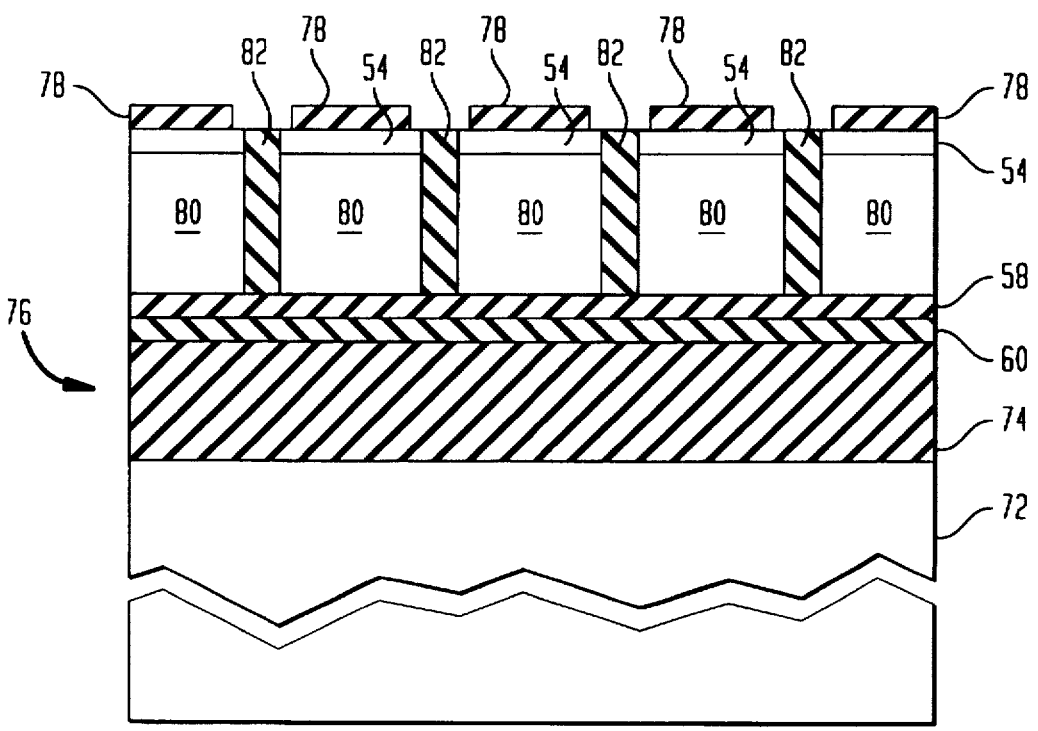

FIG. 8B, shows the composite wafer 76 after a processing sequence where the unmasked portions of the P+ diffused layer 54 and underlying portions of the N− epi layer 56 are anodized to form porous silicon trenches. The porous silicon trenches are then oxidized to form the solid oxide trenches 82 which define and separate N– single crystal silicon wells 80 as shown in FIG. 8B.

Figure 8C:
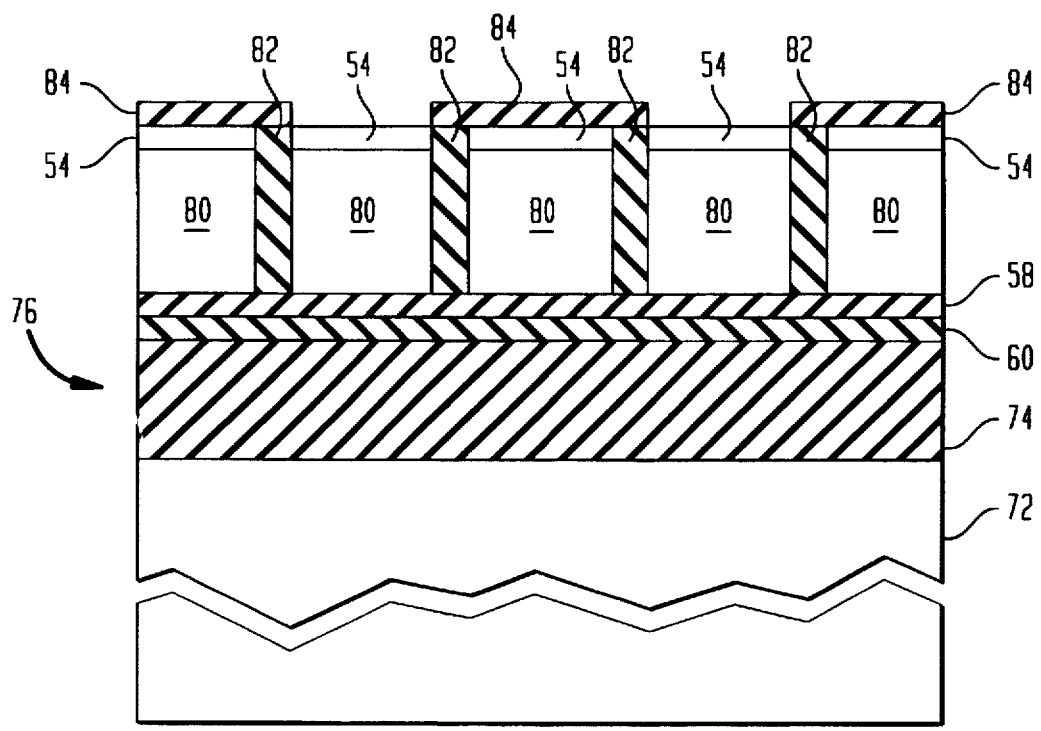

In FIG. 8C, the previously defined nitride mask layer 78 has been removed and replaced by another nitride mask layer 84 of about 1000 angstroms thick. The nitride layer 84 is patterned to form a mask for performing a conventional silicon etch that will be used to remove selected portions of the P+ diffused layer 54.

Figure 8D:
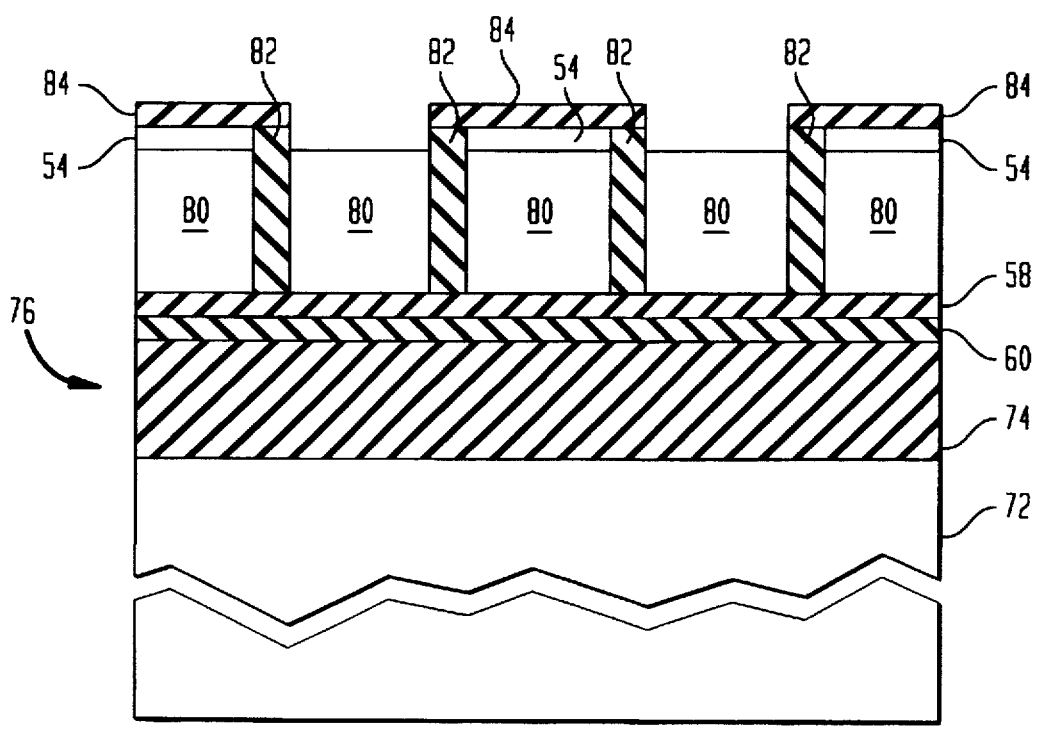

FIG. 8D depicts the composite wafer 76 after a conventional silicon etch has been used to remove portions of P+ diffused layer 54 above selected N– single crystal silicon wells 80 which are not to be converted P+ single crystal silicon wells as will be later explained.

Figure 8E:
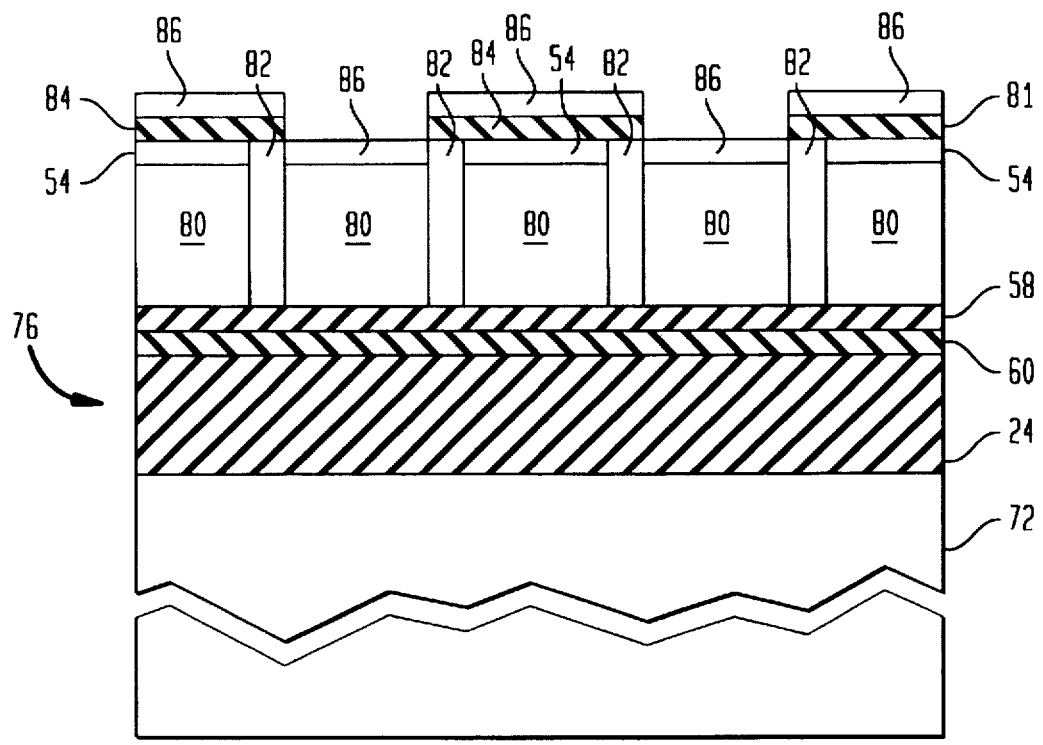

FIG. 8E depicts the composite wafer 76 after a N– epi layer 86 is grown across the top surface thereof. The N– epi layer deposited over the N– single crystal silicon wells 80 will grow as single crystal silicon. The N– epi layer deposited over the nitride mask layer 84 will grow as polycrystalline silicon.

Figure 8F:
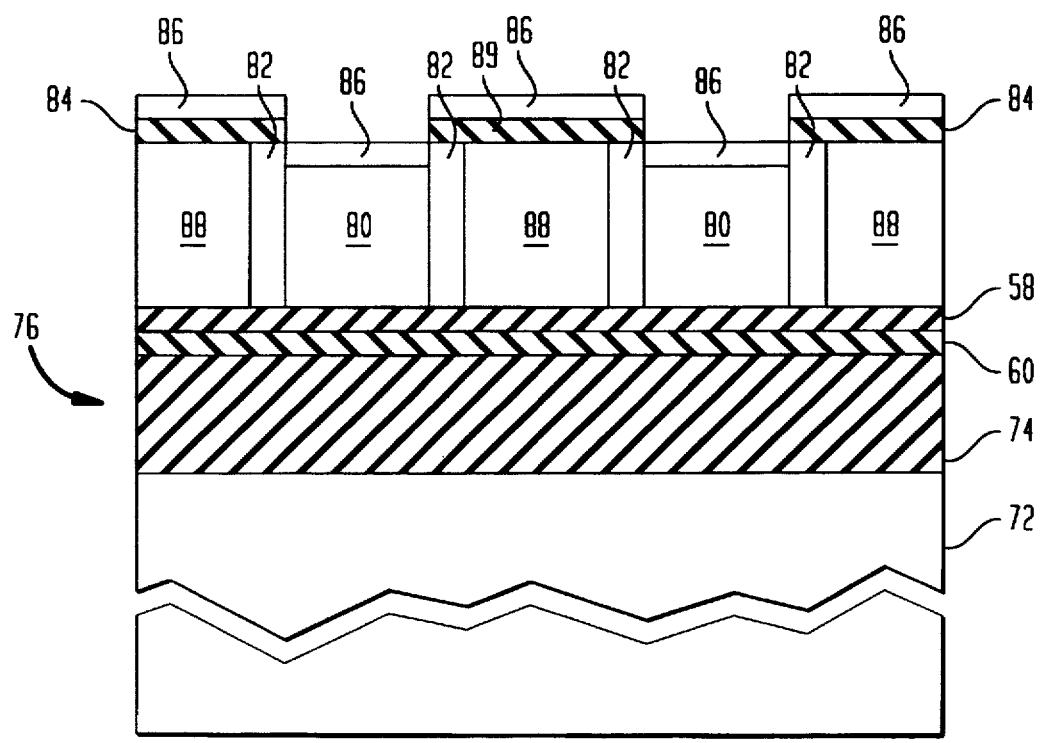

FIG. 8F depicts the results of a high temperature drive-in cycle where the remaining portions of the P+ diffused layer 54 have converted their associated N– single crystal wells to P single crystal silicon, thereby forming P wells 88.

Figure 8G:
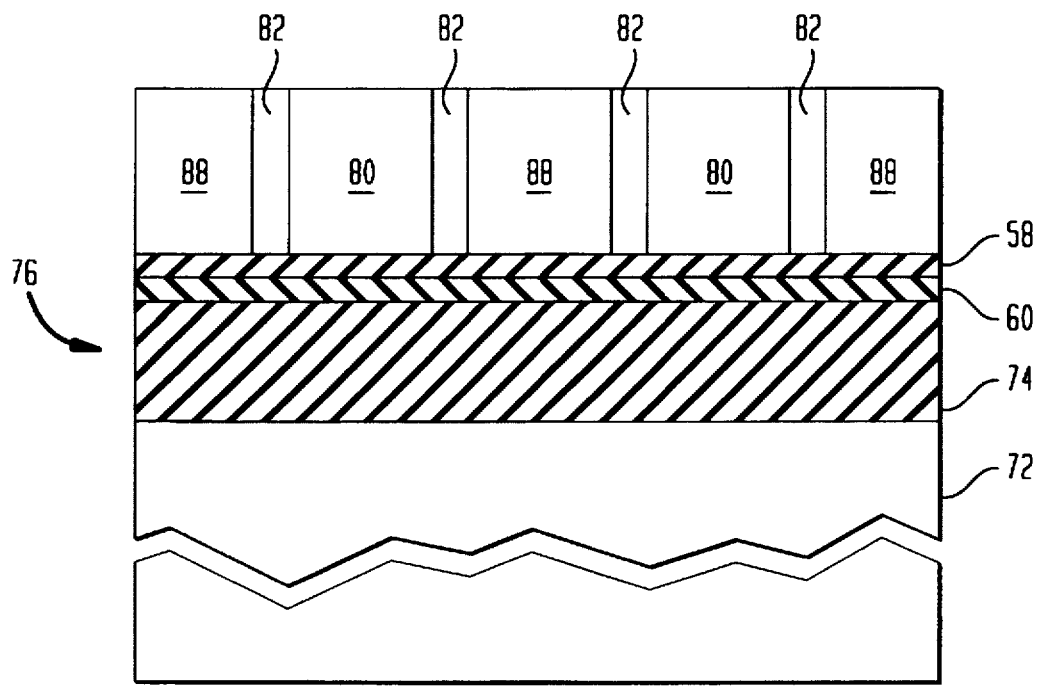

FIG. 8G depicts the final structure of the composite wafer 76 after the nitride mask layer 84 has been etched away which results in dielectrically isolated wells of either N– or P– type to be used in the manufacture of semiconductor devices. As can be seen in FIG. 8G, etching of the mask layer 84 lifts off the polysilicon portions of N– epi layer 86 grown atop of it, thereby exposing the underlying P– wells 88. The structure shown therein now comprises a first plurality of dielectrically isolated P wells 88 of single crystal silicon and a second plurality of dielectrically isolated N– wells 80 of single crystal silicon. The P and N– wells are dielectrically isolated from the substrate 72 by the oxide layer 74 and the oxide layer 60. The P and N– wells are dielectrically isolated from each other by the silicon dioxide trenches 82.

The method of the present invention offers no restriction on the conductivity type, location, size, or number of the wells provided. Further, the method of the present invention enables this to be achieved without restriction on insulator thickness, trench width, and/or well depth, and provides wells of superior crystallographic quality silicon for device, or multiple device manufacture.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

What is claimed is:

1. A semiconductor device comprising:

a substrate wafer;

a first plurality of device regions fabricated from a semiconductive material of only a first conductivity, said first plurality of device regions being dielectrically isolated from said substrate wafer by first dielectric isolation means, said first dielectric isolation means comprising at least one layer of nitride material on which said first plurality of device regions are directly disposed, at least one layer of oxide material and a polysilicon layer; and a second plurality of device regions fabricated from said semiconductive material of only a second conductivity, said second plurality of device regions being dielectrically isolated from said substrate wafer by said first dielectric isolation means, said device regions of said second plurality being disposed among said device regions of said first plurality to provide device regions of said first and second conductivities, wherein said device regions are dielectrically isolated from each other by second dielectric isolation means.

2. The semiconductor device according to claim 1, wherein said at least one layer of oxide material is disposed between said substrate wafer and said device regions of said first and second conductivities.

3. The semiconductor device according to claim 2, wherein said at least one layer of oxide material comprises two layers of oxide material disposed between said substrate wafer and said device regions of said first and second conductivities.

4. The semiconductor device according to claim 2, wherein said layer of nitride material is disposed between said at least one layer of oxide material and said device regions of said first and second conductivities.

5. The semiconductor device according to claim 2, wherein said polysilicon layer is disposed between said at least one layer of oxide material and said device regions of said first and second conductivities.

6. The semiconductor device according to claim 1, wherein said second dielectric isolation means comprises a plurality of solid oxide trenches, each of said solid oxide trenches being disposed between said device regions of said first conductivity and said device regions of said second conductivity.

7. The semiconductor device according to claim 1, wherein said semiconductive material comprises single crystal silicon.

8. The semiconductor device according to claim 1, wherein said substrate wafer is fabricated from a monocrystalline silicon material.

9. The semiconductor device according to claim 1, wherein said first conductivity of said first plurality of device regions is opposite to said second conductivity of said second plurality of device regions.

10. A semiconductor device comprising:

a substrate wafer;

a first plurality of device regions fabricated from a semiconductive material of a first conductivity, said first plurality of device regions being dielectrically isolated from said substrate wafer by first dielectric isolation means, said first dielectric isolation means comprising at least one layer of nitride material, at least one layer of oxide material and a polysilicon layer, said first plurality of device regions being directly disposed on said at least one layer of nitride material; and a second plurality of device regions fabricated from said semiconductive material of a second conductivity, said second plurality of device regions being dielectrically isolated from said substrate wafer by said first dielectric isolation means, each of said device regions of said second plurality being disposed among said device regions of said first plurality to provide device regions of said first and second conductivities, wherein said device regions are dielectrically isolated from each other by second dielectric isolation means.

* * * * *